(12) United States Patent
Albrecht et al.

(10) Patent No.: US 11,331,759 B2
(45) Date of Patent: May 17, 2022

(54) SOLDER ALLOY FOR POWER DEVICES AND SOLDER JOINT HAVING A HIGH CURRENT DENSITY

(71) Applicant: Senju Metal Industry Co., Ltd., Tokyo (JP)

(72) Inventors: Hans-Jurgen Albrecht, Berlin (DE); Klaus Wilke, Berlin (DE); Katsuaki Suganuma, Ibaraki (JP); Minoru Ueshima, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 17/010,990

(22) Filed: Sep. 3, 2020

(65) Prior Publication Data

US 2021/0008670 A1    Jan. 14, 2021

Related U.S. Application Data

(62) Division of application No. 14/001,561, filed as application No. PCT/JP2012/054774 on Feb. 27, 2012, now abandoned.

(30) Foreign Application Priority Data

Feb. 25, 2011    (JP) ................................. 2011-057183

(51) Int. Cl.
*B23K 35/26* (2006.01)
*H05K 3/34* (2006.01)
*B23K 35/02* (2006.01)
*C22C 13/02* (2006.01)
*C22C 13/00* (2006.01)
*C22C 1/02* (2006.01)
*H05K 1/02* (2006.01)

(52) U.S. Cl.
CPC ........ *B23K 35/262* (2013.01); *B23K 35/0244* (2013.01); *C22C 1/02* (2013.01); *C22C 13/00* (2013.01); *C22C 13/02* (2013.01); *H05K 3/3463* (2013.01); *H01L 2224/48247* (2013.01); *H01L 2224/73265* (2013.01); *H01L 2924/13055* (2013.01); *H01L 2924/13091* (2013.01); *H05K 1/0263* (2013.01); *Y10T 403/479* (2015.01)

(58) Field of Classification Search
CPC ..................................................... C22C 13/02
See application file for complete search history.

(56) References Cited

U.S. PATENT DOCUMENTS

| 5,658,528 | A  | 8/1997  | Ninomiya et al. |
| 5,733,501 | A  | 3/1998  | Takao et al.    |
| 5,958,333 | A  | 9/1999  | Matsunaga et al.|
| 6,822,327 | B1 | 11/2004 | Mithal et al.   |

(Continued)

FOREIGN PATENT DOCUMENTS

| JP | H08206874 A | 8/1996 |
| JP | H0970687 A  | 3/1997 |

(Continued)

*Primary Examiner* — Christopher S Kessler
(74) *Attorney, Agent, or Firm* — The Webb Law Firm

(57) ABSTRACT

A solder joint which is used in power devices and the like and which can withstand a high current density without developing electromigration is formed of a Sn—Ag—Bi—In based alloy. The solder joint is formed of a solder alloy consisting essentially of 2-4 mass % of Ag, 2-4 mass % of Bi, 2-5 mass % of In, and a remainder of Sn. The solder alloy may further contain at least one of Ni, Co, and Fe.

12 Claims, 3 Drawing Sheets

(56) References Cited

U.S. PATENT DOCUMENTS

| | | |
|---|---|---|
| 8,598,464 B2 | 12/2013 | Sakatani et al. |
| 2001/0036420 A1 | 11/2001 | Matsunaga et al. |
| 2001/0050181 A1 | 12/2001 | Miura et al. |
| 2003/0015575 A1 | 1/2003 | Yamaguchi et al. |
| 2010/0297470 A1 | 11/2010 | Munekata et al. |
| 2010/0307823 A1 | 12/2010 | Kawamata et al. |

FOREIGN PATENT DOCUMENTS

| | | |
|---|---|---|
| JP | H1071488 A | 3/1998 |
| JP | 200171174 A | 3/2001 |
| JP | 200296191 A | 4/2002 |
| JP | 200572173 A | 3/2005 |
| JP | 2010123873 A | 6/2010 |
| WO | 0018536 A1 | 4/2000 |
| WO | 2010122764 A1 | 10/2010 |

SOLDER ALLOY FOR POWER DEVICES AND SOLDER JOINT HAVING A HIGH CURRENT DENSITY

CROSS-REFERENCE TO RELATED APPLICATIONS

This application is a divisional of U.S. patent application Ser. No. 14/001,561 filed Dec. 27, 2013, which is the United States national phase of International Application No. PCT/JP2012/054774 filed Feb. 27, 2012, and claims priority to Japanese Patent Application No. 2011-057183 filed Feb. 25, 2011, the disclosures of which are hereby incorporated in their entirety by reference.

TECHNICAL FIELD

This invention relates to a solder alloy and a solder joint which can withstand a high current density without being damaged by electromigration. The present invention also relates to an electronic element (electronic device) and particularly a power device using such a solder joint.

BACKGROUND ART

Soldering is the most commonly used method for electrically connecting electronic devices to circuit boards and similar substrates. As electronic devices become increasingly small, the size of solder joints for connecting electronic devices to other members is similarly becoming smaller, and as their shape becomes smaller, the current density in each joint is becoming extremely large. At present, solder joints normally used for electronic devices do not have a considerably high current density. However, in the future, there is expected to be a demand for solder joints which can be reliably used for long periods at quite high current densities such as 5-100 kA/cm$^2$. Such a high current density is particularly anticipated in electrical equipment such as power devices used in hybrid electric vehicles, inverters, and the like.

In the past, electronic devices of interest were ones used in digital circuits such as substrates for computers. Recently, however, household electrical appliances such as electric cooking appliances and air conditioners are also becoming computerized, and electronic devices carrying a large current are becoming more common in these appliances. In recent years, vehicle control is becoming increasingly electronic, and there are now vehicles such as hybrid vehicles and electric vehicles having a large portion thereof constituted by electronic parts.

Electronic devices which control these large currents include those referred to as power devices (semiconductor devices for power control) which handle 1 ampere or more of current. These devices include not only semiconductors such as power transistors and power diodes but also inverters, power modules, and the like which have been made into components.

Because a power device handles a high voltage and a high current, a large amount of heat is generated in its interior. Therefore, a Cu-base heat sink, an insulating substrate, and a silicon device are often connected to each other with solder to provide heat dissipation. Even when they are connected to each other by wire bonding, solder bonding is used between lands in order to provide heat dissipation. Due to a large current flowing in these solder joints, they have a high current density, and electromigration in which Cu in Cu lands or Ni in Ni lands migrates into the solder may occur and cause problems.

Electromigration is a phenomenon in which the flow of electrons which is produced when a large current flows causes metal atoms to flow in the direction of the flow of electrons. Electromigration sometimes produces voids and cracks on the cathode side of a solder joint, and extrusion of solder and growth of intermetallic compounds sometimes occur on the anode side thereof. These changes in the microstructure of a solder joint and the resulting temperature increase sometimes produce damage such as fracture of the solder joint, and such damage may cause an electronic device connected to the solder joint to partly or entirely malfunction.

Because power devices have a high current density and a large amount of heat is generated from power devices, conventional solders for power devices have used high-temperature solders such as Pb-5Sn or Pb-10Sn (mass %) which have a melting temperature of around 300° C. Due to environmental concerns, lead-free solders for use in power devices are being studied, but a lead-free solder composition which is optimal for power devices has not yet been determined.

The above-mentioned Sn-5Sb solder and Sn-10Sb solder are at present well known as lead-free solders for power devices. In addition, the present inventors disclosed a solder paste containing a Bi-based solder power having a solidus temperature of at least 260° C. and a thermosetting adhesive (Patent Document 1).

Solder alloys having a Sn—Ag—Bi—In-composition which have been disclosed include a "lead-free solder alloy characterized by consisting essentially of at least 0.8 weight % to at most 5 weight % of Ag, at least 0.1 weight % of each of In and Bi with the total of both being at most 17 weight %, and a remainder of Sn and unavoidable impurities" (Patent Document 2), and "a solder material having Sn and Ag as a basic composition with an Ag content of 0.1-20 weight %, characterized by containing at least one of 0.1-25 weight % of Bi and 0.1-20 weight % of In, and a remainder of Sn" (Patent Document 3) and the like.

PRIOR ART DOCUMENTS

Patent Documents

Patent Document 1: JP 2005-72173 A
Patent Document 2: JP 9-70687 A
Patent Document 3: JP 8-206874 A

SUMMARY OF THE INVENTION

Problem which the Invention is to Solve

As electronic devices become increasingly small, solder joints which connect components inside the electronic devices and solder joints which connect the electronic devices to other members are similarly becoming smaller, and as their shape is becoming smaller, the current density in each joint is becoming extremely large. In addition, electronic devices which are connected to the electrodes of printed circuit boards of electronic equipment are becoming smaller, their electrical resistance is becoming higher, and the current density in each joint is becoming extremely high. Electromigration develops in such solder joints having a high current density. Electromigration is a phenomenon in which metal atoms migrate and it causes voids and cracks to develop on the cathode side of a joint and extrusion of solder and growth of intermetallic compounds to occur on the anode side, thereby shortening the life of electronic devices and electronic equipment.

As electronic devices become smaller, joints which connect electronic devices and printed circuit boards are also becoming smaller. Because electric current flows in these minute joints, the current density is large even with solder joints for connection of printed circuit boards having fine patterns, and the occurrence of electromigration has been becoming a problem.

The problem to be solved by the present invention is to develop a solder alloy which does not develop electromigration even when it connects electronic parts such as power diodes having an extremely high current density or small electronic devices having a fine pattern to printed circuit boards.

Means for Solving the Problem

The inventors of the present invention found that the cause of the occurrence of electromigration is that due to the current which is generated by the operation of electronic devices or printed circuit boards of electronic equipment, electrons flow in the opposite direction from the current and the metal in a joint moves together with the movement of electrons, thereby causing voids and cracks to develop on the cathode side of the joint. They also found that electromigration is alleviated by controlling abrupt movement of metal atoms in the joints of printed circuit boards of electronic equipment, and they completed the present invention.

The present invention is a solder alloy suitable for assembly of electronic parts such as power diodes having an extremely high current density or small electronic devices having a fine pattern. The solder alloy consists essentially of 2-4 mass % of Ag, 2-4 mass % of Bi, 2-5 mass % of In, and a remainder of Sn. It is also a solder joint which connects a small electronic device to a circuit board using this solder alloy.

A solder alloy according to the present invention may further contain at least one of 0.01-0.3 mass % of Ni, 0.01-0.32 mass % of Co, and 0.01-0.1 mass % of Fe.

In explanations in this description prescribing a solder alloy composition, % by itself means mass %.

An electronic device in which a solder alloy and a solder joint according to the present invention are used and a solder joint which connects such an electronic device to a printed circuit board are effective at preventing electromigration.

Electromigration occurs due to a metal in lands such as Cu moving and diffusing into the solder alloy of a solder joint together with movement of electrons. If the movement of a metal in the lands such as Cu having an electric charge into a solder alloy can be controlled, the movement of Cu in the lands or of an intermetallic compound formed in the bonding surface between the Cu lands and the solder alloy into the solder alloy can be prevented, and voids and cracks do not develop even with a joint having a high current density.

Two methods are conceivable as methods by which the solder alloy according to the present invention controls the movement of metal atoms.

A first method is a method in which the diffusion of Cu atoms in the interior of a solder alloy having a Sn matrix is suppressed so as to prevent abrupt flow of current. This method is highly effective at preventing electromigration Specifically, in this method, a metal which imparts strains to the metal lattice of the solder alloy is added to make the movement of metal atoms which move (Cu and Ni) more difficult. In the present invention, by adding Bi or Sb, the metal lattice is distorted to impart a strain and abrupt flow of current can be suppressed. In this method, because Bi has a larger atomic radius than Sb, it can impart a larger strain to the lattice. Therefore, Bi is used in the present invention.

FIG. 1 shows a model of a metal lattice which compares the case in which Bi is not present such as in a conventional SnAgCu alloy with the case in which Bi is added as in the present invention. FIG. 1(a) shows a conventional example. It can be seen that Cu atoms easily pass through a Sn lattice. FIG. 1(b) shows that when Bi is added as in the present invention, Bi atoms distort the lattice, and it becomes more difficult for Cu atoms to pass through the Sn lattice. To simplify the explanation, In and other atoms are omitted from this figure.

It was also found that the more uniform the crystal orientation, the more easily diffusion of Cu atoms in a solder alloy takes place. If the crystal orientation of the solder alloy becomes random, abrupt diffusion of Cu no longer occurs. In particular, diffusion is extreme in the c-axis direction of the crystal orientation. Therefore, if the direction of current is made so as not to coincide with the c-axis direction, diffusion of Cu inside the solder alloy having a Sn matrix is suppressed and abrupt diffusion of Cu does not occur. In the present invention, In (indium) is added as a metal which can suppress alignment of the crystal orientation, as a result of which electromigration is suppressed.

A second method is one in which a reaction layer of an intermetallic compound or compounds is formed in the interface between a metal such as Cu which is used to form lands and the solder alloy. In the present invention, In, Ni, and Co are used. Current does not readily flow in the periphery of an intermetallic compound layer formed by a reaction of Cu used in lands and In, Ni, or Co in a solder alloy. However, only the periphery of a reaction layer of intermetallic compounds formed by this method is an area which suppresses the flow of current, so the effect of suppressing current is local. Accordingly, it is less effective than the first method which is a method which produces an overall effect and makes it difficult for current to flow inside a solder alloy. In the present invention, a method which has an overall effect and makes it difficult for Cu to diffuse into a solder alloy and a method which has a local effect and forms a reaction layer of intermetallic compounds in the interface between a metal such as Cu used in lands and the solder alloy are both used, whereby it is possible to obtain a solder joint in which the occurrence of electromigration is minimized.

In order to control the movement of metal atoms and prevent electromigration, In and Bi are added to a Sn—Ag solder in a solder alloy according to the present invention, thereby imparting strains to the metal lattice of the solder alloy and controlling the crystal orientation of the solder alloy. A solder alloy according to the present invention has a Sn—Ag—In—Bi solder composition like that described in Patent Document 2 or Patent Document 3, and the solder composition falls into the range of a low-temperature solder.

Electronic devices or substrates with which electromigration is a problem are electronic devices such as power devices in which a large current flows, electronic devices such as CPUs having fine patterns, or substrates on which such devices are mounted. All of these have the common characteristic that they have a high current density and hence generate heat due to a high current.

In the present invention, a solder composition which controls the movement of metal atoms and prevents electromigration is coincidentally a solder composition falling into the range referred to as a low-temperature solder. Electronic devices and substrates which have the problem of electromigration have problems with respect to heat generation due to large currents. Therefore, high-temperature solder alloys having a high melting point referred to as high-temperature solders have been used with such devices and substrates. If a solder composition like that described in Patent Document 2 or Patent Document 3 in which In or Bi is added to simply lower the melting temperature of the solder is used with electronic devices or substrates which have the problem of electromigration, due to a high current density of a solder joint with flowing of a large current, solder joints end up locally melting, and electromigration ends up increasing because the movement of metal atoms due to electromigration can no longer be controlled.

A solder alloy for power devices according to the present invention is suitable for power transistors such as IGBTs (insulated gate bipolar transistors) or MOSFETs (MOS field effect transistors) used in air conditioners, electric rice cookers, machine tools, and the like.

FIG. 2 schematically shows an IGBT. In the figure, a die bonding electrode is provided on a copper-based heat sink 25, and a solder layer 27 is provided atop the electrode. The solder layer 27 is connected to an IC chip 22 through a plating layer 24 which is formed on the IC chip 22 which is mounted on the solder layer 27. A Cu clip 21 extends from an electrode formed atop the IC chip 22 to a Cu lead frame 20. The IC chip 22 is connected to the Cu clip 21 and the Cu clip 21 is connected to the lead frame 20 by solder joints 26.

Particularly when a solder alloy according to the present invention is used for a joint connecting the emitter and the collector of a power device, it is possible to maintain quality for long periods, which is desirable, even if there is a high current density between terminals.

A solder alloy for power devices according to the present invention can be used not only inside power devices but is used for joints having a large current between the devices and a printed circuit board such as joints between a power device and a printed circuit board or joints between a CPU and a printed circuit board which has a high current density, thereby preventing electromigration which develops in lands made of Cu, Ni, or the like. When connecting such an electronic device to a printed circuit board, the same reflow profile as for normally used Sn-3.0Ag-0.5Cu alloy may be used.

Namely, a solder alloy for power devices according to the present invention can be used for power devices having solder joints through which a current having a current density of 5-100 kA/cm$^2$ flows. It can also be used for mounting power devices on printed circuit boards with joints through which a current with a current density of 5-100 kA/cm$^2$ flows.

A solder alloy for power devices according to the present invention can guarantee excellent heat resistance up to temperature conditions around 150° C. inside an electronic device when the device is assembled with the solder alloy. However, since a power device allows a large current of at least 1 ampere to flow, if the solidus temperature of the solder alloy is too low, the solder joint becomes half molten, and movement of metal atoms can no longer be controlled.

Bi (Bismuth) Content:

Due to segregation, a pure Bi phase crystallizes out over an entire solder fillet. Therefore, if the current density locally becomes high in a soldered joint, since the solder itself generates Joule heat, the temperature of the solder joint instantaneously exceeds 150° C. and the joint partially melts. In a usual heat cycle test or in a conventional power cycle test in which the pitch is wide and the current flow is small, even if Joule heat is generated, there are no major problems because due to heat diffusion, the average temperature rises instead of the temperature of a portion of a solder fillet locally increasing. In addition, a temperature increase takes place slowly, so the pure Bi phase is redissolved in the Sn matrix, thereby allowing the low melting point phase to disappear, and there is no concern of remelting due to segregation of Bi.

However, with a solder joint according to the present invention having a high current density, if the Bi content exceeds 4%, Bi segregates over the entire solder fillet, and if the current density becomes high in a portion where Bi has segregated, as Bi itself has roughly at least 5 times the electrical resistance of Sn, heat generation becomes violent. In addition, the thermal conductivity of Bi is an extremely low value of roughly $\frac{1}{7}$ that of Sn and $\frac{1}{40}$ that of Cu, so generated heat is not easily dissipated and local heating is accelerated. In remelted portions, diffusion of Cu becomes more and more violent, so electromigration locally progresses and the life span is shortened until an open circuit occurs. Namely, even with Bi which is effective at imparting strains to the Sn crystal lattice and suppressing diffusion of Cu, the pure Bi phase which crystallized out in the Sn matrix no longer has the effect of suppressing the diffusion of Cu in the Sn matrix, and if it is present in portions having a high current density, it promotes generation of heat and interferes with heat dissipation, so it greatly decreases resistance to electromigration. Therefore, the Bi content is made at most 4% so that the segregation of a pure Bi phase at the time of solidification of a solder fillet will be minimized.

In (Indium) Content:

The addition of In causes a reaction layer with Cu wiring to change from Cu6Sn5 to Cu6(SnIn)5. In addition, In dissolves in the Sn matrix to form a solid solution, thereby imparting strains to the crystal lattice and suppressing diffusion of Cu, so it improves resistance to electromigration. On the other hand, as the added amount of In increases, the solidus temperature of the solder alloy decreases, and particularly at a high temperature such as 125° C., solid solution hardening (strengthening) due to In cannot be expected. Namely, In atoms no longer impart strains to the crystal lattice of the Sn matrix, and mutual diffusion in the Sn matrix is accelerated by the decrease in melting point, thereby decreasing resistance to electromigration. Furthermore, at a high temperature of 125° C., a portion of the β-Sn phase transforms to γ-SnIn phase, thereby causing diffusion of Sn and In atoms to become violent and forming a large number of atomic vacancies. This makes it easier for Cu to diffuse through atomic vacancies, so transformation to γ-SnIn phase at a high temperature must be avoided as much as possible. Therefore, the added amount of In is made at most 5%. If possible, it is at most 4%. However, if the added amount of In is made less than 2%, the In concentration in a reaction layer with Cu electrodes decreases, and the occurrence of electromigration increases.

In general, a decrease in the solidus temperature of a solder activates diffusion of atoms and the formation of atomic vacancies in the solder at a high temperature. Therefore, in order to suppress electromigration, which requires suppression of diffusion of Cu, a solder having a high solidus temperature is desirable. However, it was found that solid solution hardening due to the addition of Bi is maintained even at 200° C., thereby making it possible to suppress movement of transition in Sn and formation of atomic vacancies. In addition, the problem of electromigration due to acceleration of diffusion of Cu in β-Sn caused by a decrease in the melting point is suppressed by adjusting the added amount of In so as to suppress the diffusion of Cu in a reaction layer with electrodes. Thus, we found the added amount of In for minimizing a decrease in resistance to electromigration due to a decrease in melting point.

Effects of the Invention

Even though a solder alloy for a power device according to the present invention has a so-called low-temperature solder composition containing Bi and In, it has heat resistance of around 150° C. even if it is used for joints for connection inside a power device. In addition, it is not damaged by electromigration even at a high current density of 5-100 kA/cm$^2$. Accordingly, a power device made using a solder alloy according to the present invention can stably operate for long periods. Furthermore, if a solder alloy according to the present invention is used for joints for connection of power devices to printed circuit boards by mounting on printed circuit boards or connecting joints for devices such as CPU having fine wiring to printed circuit boards, electromigration does not develop even with a joint which generates a high current density of 5-100 kA/cm$^2$, so it is possible to obtain stable quality over long periods.

MODES FOR CARRYING OUT THE INVENTION

Figure 1:
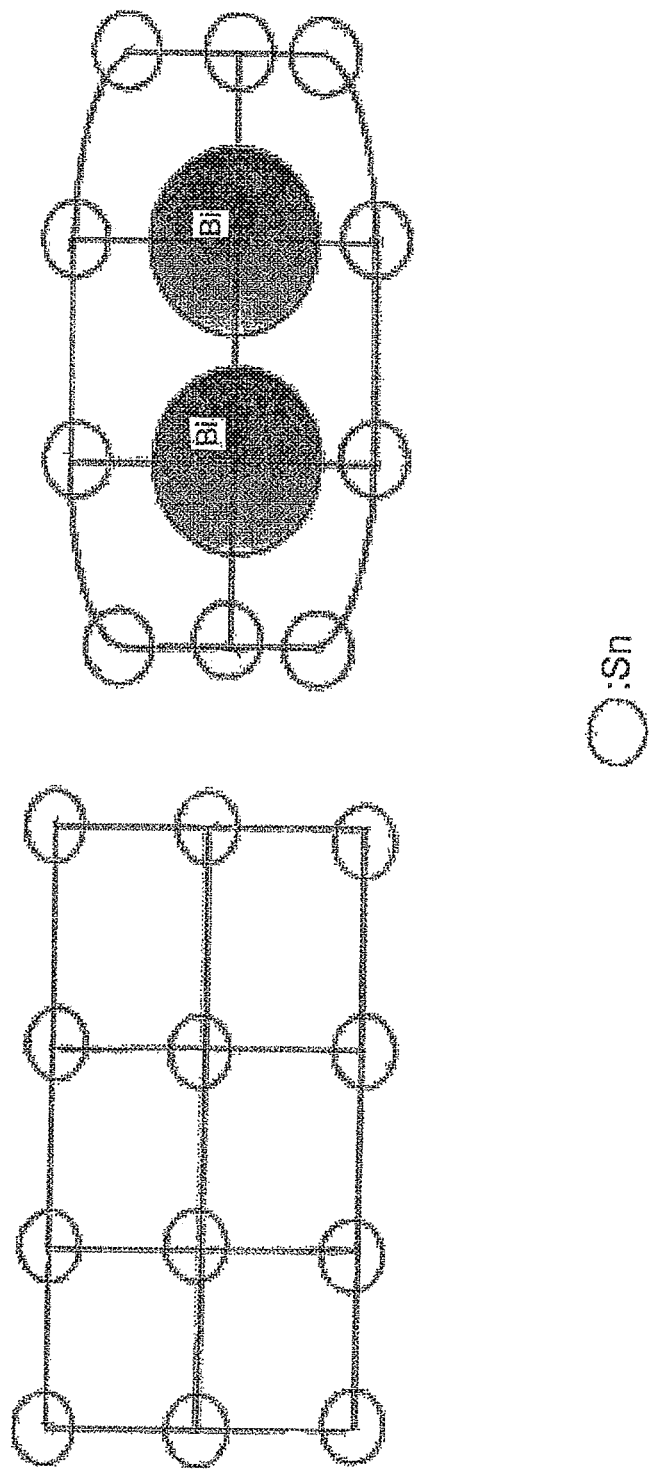
FIGS. 1(a) and 1(b) show a model of a Sn lattice of a conventional example and an example of the present invention, respectively.
Figure 2:
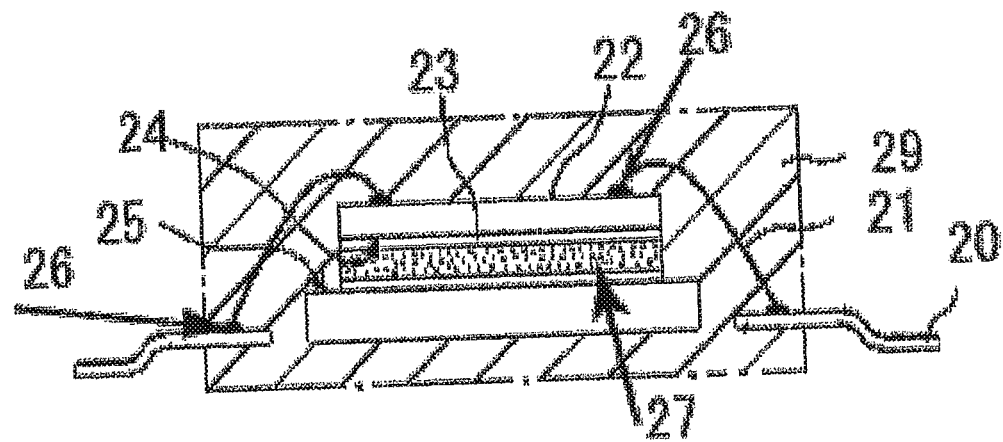
FIG. 2 is a schematic view of an IGBT (insulated gate bipolar transistor).

The present invention is an alloy consisting essentially of 2-4 mass % of Ag, 2-4 mass % of Bi, 2-5 mass % of In, and a remainder of Sn. The Ag content may be at most 3.2%. The In content may be at most 4.5%.

The above-described alloy may preferably further contain at least one of 0.05-0.2 mass % of Ni, 0.05-0.2 mass % of Co, and 0.02-0.1 mass % of Fe.

A solder joint according to the present invention can be formed from an alloy consisting essentially of 2-4 mass % of Ag, 2-4 mass % of Bi, 2-5 mass % of In, and a remainder of Sn.

An alloy which constitutes the above-described joint may preferably further contain at least one of 0.05-0.2 mass % of Ni, 0.05-0.2 mass % of Co, and 0.02-0.1 mass % of Fe.

A solder joint according to the present invention is not limited to use with specific electronic devices, but it is particularly effective when it is used with electronic devices which consume a large amount of electric power such as power transistors since it can prevent electromigration.

A solder joint according to the present invention can be formed in various shapes. For example, inside a power device, methods such as wire bonding or flip clip bonding by reflow soldering using preforms, solder balls, or solder paste are conceivable.

A solder joint for mounting of a power device on a printed circuit board or mounting a CPU on a printed circuit board may be formed by connecting a lead or an electrode of an electronic device by flow soldering. Alternatively it can be formed by reflow soldering of solder paste, solder balls, or various preforms. In addition, a solder joint according to the present invention may be formed by manual soldering. The method of soldering is determined by whether the power device is a discrete type or a surface mounted type.

The reasons for limits on the range of the components of the composition in the above-described alloy are as follows.

Improvement of Electromigration in a Sn—Ag—Bi—In Alloy:

The Ag content is determined from the standpoints of the melting temperature and resistance to thermal fatigue of the solder. If the Ag content is lower than 2%, thermal fatigue properties of the solder worsen. On the other, if it exceeds 4%, its liquidus temperature increases, so the number of voids increases and the quality of a solder joint decreases. Accordingly, the Ag content in the present invention is at least 2 mass % and at most 4 mass %.

In particular, when forming bumps using solder balls, coarse Ag$_3$Sn compound of about the same size as the diameter of the solder balls crystallizes out at the time of soldering, and at the time of subsequent mounting on a mother board or flip chip mounting, such coarse compound crystallizes and become the cause of soldering defects. As the added amount of Ag in the present invention increases, crystallization of coarse Ag$_3$Sn gradually becomes marked. In order to avoid this problem, an Ag content of at most 3.5% is better, and in order to decrease crystallization of primary crystals and improve the reliability of a solder joint, an Ag content of at least 2.5% is preferred. Therefore, a more preferred Ag content is at least 2.5 mass % and at most 3.5 mass %.

Bi forms a solid solution with a Sn matrix and suppresses the diffusion of Cu in the Sn matrix. Bi forms a solid solution in the Sn matrix, and it imparts strains to the lattice and suppresses diffusion of Cu atoms in the matrix.

Electromigration easily develops at a high temperature of around 150° C. Accordingly, it is important to maintain a state of solid solution hardening which occurs due to the addition of Bi at such a high temperature. In general, a state of solid solution hardening disappears if a solder joint is heated to a high temperature of 150° C., and the solubility limit of Bi in Sn becomes at least 10% at 150° C. Therefore, when Bi is added, it is thought that diffusion of Bi atoms in a Sn matrix becomes violent and Sn lattice strains are alleviated. It was found that when Bi is added in an amount of at least 2%, solid solution hardening is maintained even at a high temperature of at least 150° C., and the presence of strains in the Sn lattice caused by continuing solid solution hardening suppresses the diffusion of Cu atoms. The tensile strength at 160° C. is 19 MPa and 28 MPa for SnAg0.5Cu and Sn3Ag0.8Cu3Bi respectively, and at 200° C., it is 13 MPa and 20 MPa, respectively. If the Bi content is less than 2 mass %, solid solution hardening is not exhibited, and strains do not appear in the Sn lattice. However, if an excessive amount of Bi is added, in addition to the above-described decrease of the solidus temperature, a low melting point phase (low-temperature phase) which melts at 139° C. crystallizes out due to segregation at the time of soldering. Since a solder joint is sometimes heated to a high temperature of 150° C., the formation of a liquid phase at that time due to the presence of such a low-temperature phase in a solder joint cannot be avoided. As a result, due to an increase in stress load caused by thermal fatigue, cracks suddenly develop. Therefore, the added amount of Bi is made at most 4%. The added amount of Bi in the present invention is at least 2 mass % and at most 4 mass %.

As an example, in the case of a Sn3.0Ag0.8Cu5Bi solder alloy, Bi crystallizes over the entirety of the fillet of a solder joint due to segregation. When 4% of Bi is added, Bi crystallizes with a size of around 10 µm and is dispersed over the entirety of a fillet, but the area where Bi is concentrated does not pass through the entire fillet. However, if Bi is added in an amount of at least 7%, the area where Bi segregates passes through the fillet. In this case, if a solder joint is rapidly exposed to a high temperature of 150° C., a liquid phase portion passes through the fillet, so even if diffusion of Cu atoms is suppressed and electromigration can be prevented, resistance to thermal fatigue is markedly reduced. Therefore, such a high Bi content is not suitable for a solder joint requiring high reliability even under high currents.

The added amount of Bi is limited to at most 4% and preferably to at most 3%. If the Bi content is 3% or below, segregation of Bi is ascertained in several locations in a fillet, and even if the portions where Bi segregates remelt at 139° C., progression of cracks can be prevented. The tendency of Bi to segregate is not changed by the addition of In.

In the same manner as Bi, In (indium) forms a solid solution with Sn and imparts lattice strains to the Sn matrix. Solid solution hardening due to the addition of In is maintained even at a high temperature of 160° C. Although its effect is smaller than Bi, In can also suppress diffusion of Cu in a Sn matrix.

When 2-5% of In is added to a Sn alloy, primary crystals become γ-SnIn rather than β-Sn, and the crystallized γ-SnIn phase becomes a β-Sn phase due to solid phase transformation at 100° C. or below. With a β-Sn phase which underwent solid phase transformation in this manner, crystal grains are refined so that their size becomes at most 50 µm and the crystal orientation becomes random. With a β-Sn phase, the speed of diffusion of Cu atoms in the c-axis direction becomes fast. If the crystal grains in a solder joint are large, there is a high probability of the direction of current coinciding with the direction of the c-axis. Furthermore, because the crystal grains are large and the above-described probability is high, the distance over which Cu atoms can diffuse becomes long, and the amount of Cu which diffuses into solder from Cu electrodes increases. As a result, open circuits in Cu electrodes due to electromigration occur extremely easily in a short period of time. However, when crystal grains are small, even if the direction of current coincides with the c-axis of some of the crystal grains, the crystal grains themselves are small, and the total amount of Cu which moves from Cu electrodes into the solder is suppressed. As a result, the life span until conduction paths are broken by electromigration becomes long.

If the added amount of In is smaller than 2%, there is almost no crystallization of γ-SnIn phase as primary crystals. From the initial stage of solidification, a β-Sn phase crystallizes and continuously grows. Accordingly, a phase transformation due to a solid phase reaction does not develops, and the direction of current coincides with the c-axis direction of coarse β-Sn crystals. Therefore, the diffusion of Cu atoms in a solder joint increases and open circuits occur in a short length of time.

On the other hand, if In is added in excess of 5%, a β-Sn phase is formed at room temperature, but at 150° C., the ratio of β-Sn phase to γ-SnIn becomes approximately 7:3. This means that a solder joint undergoes a phase transformation during use. If a phase transformation from β-Sn to β-Sn and γ-SnIn occurs during use, a solder joint deforms and short circuits occur between adjoining electrodes. Therefore, the In content is limited to at most 5%. The In content in the present invention is at least 2 mass % and at most 5 mass %. Preferably it is at least 3 mass % and at most 4 mass %.

The addition of In can directly suppress electromigration. Normally, intermetallic compounds such as Cu6Sn5 and Cu3Sn are formed in the interface between a Cu electrode and a solder alloy. The movement of Cu atoms in these intermetallic compound phases (also referred to below as reaction phases) is rapid. Due to electromigration, the Cu atoms in Cu6Sn5 diffuse into the Sn matrix, thereby causing the intermetallic compound phases to easily disappear. After the intermetallic compound phases disappear, the Cu electrode and the Sn matrix directly contact each other, and diffusion of Cu is further accelerated so that an open circuit occurs in a short length of time. On the other hand, if the intermetallic compound phase is made Cu6(SnIn)5, the diffusion of Cu atoms caused by current can be suppressed. As a result, disappearance of intermetallic compound phases by electromigration can be effectively prevented. The In content is at least 1% and preferably at least 2%. With a solder having an In content of at most 5%, the In content in a reaction phase with a Cu electrode becomes at most 7%. In other words, the In content of a Cu6(SnIn)5 reaction phase is preferably at most 7%.

Ni: The addition of 0.01-0.3% of Ni also has the effect of suppressing electromigration. The addition of Ni to a Sn—Ag—Bi—In alloy can change a reaction phase from Cu6(SnIn)5 to (CuNi)6(SnIn)5 and can suppress diffusion of Cu. If the added amount of Ni is smaller than 0.01%, a portion of a Cu6(SnIn)5 reaction phase may remain unchanged. If a region in which the current density becomes high coincides with the remaining Cu6(SnIn)5 reaction phase, the diffusion of Cu is accelerated and ultimately an open circuit occurs in a short period of time. In this case, the added amount of Ni is preferably at least 0.1%. When carrying out reflow soldering, the heating temperature at the time of reflow is made at most 260° C. Normally, this temperature is at most 240° C. If Ni is added in excess of 0.1%, the liquidus temperature exceeds 240° C. At 240° C., a small amount of Ni3(SnIn)4 remains but it has almost no effect on soldering. However, if the Ni content exceeds 0.3% and in some cases if it exceeds 0.2%, it produces an adverse effect such as an increase in the amount of voids.

However, because Ni3(SnIn)4 remains, Cu can be effectively prevented from dissolving into solder at the time of reflow. As a result, the occurrence of open circuits is prevented and the working life of a joint can be extended. The preferred added amount of Ni is 0.01-0.2% and more preferably 0.1-0.15%.

Co: The addition of 0.01-0.3% of Co also has the effect of suppressing electromigration. Adding Co to a Sn—Ag—Bi—In alloy can change the reaction phase from Cu6(SnIn)5 to (CuCo)6(SnIn)5 and can suppress diffusion of Cu. If the added amount of Co is smaller than 0.01% and sometimes if it is smaller than 0.02%, a portion of the Cu6(SnIn)5 reaction phase remains unchanged. If a region having a high current density coincides with the remaining Cu6(SnIn)5 reaction phase, diffusion of Cu is accelerated in this region, and eventually an open circuit occurs in a short period of time. The added amount of Co is preferably at least 0.1%. When carrying out reflow soldering, the heating temperature at the time of reflow is made at most 260° C. Normally, this temperature is at most 240° C. If Co is added in excess of 0.05%, the liquidus temperature exceeds 240° C. At 240° C., a small amount of Co(SnIn)2 remains, but it has almost no effect on soldering. Particularly if the Co content exceeds 0.3% and sometimes if it exceeds 0.2%, Co produces an adverse effect such as an increase in the amount of voids. However, Co(SnIn)2 remains, so Cu can be effectively prevented from dissolving into solder at the time of reflow, and as a result, the occurrence of open circuits is prevented and the working life of a joint can be extended. The added amount of Co is preferably 0.05-0.2% and more preferably 0.05-0.15%.

The addition of Co also makes the surface of a (CuCo)6(SnIn)5 reaction phase smooth, and it forms a reaction layer with a uniform thickness. If the added amount of Co is less than 0.01%, severe surface irregularities form in the (CuCo)6(SnIn)5 reaction phase, and if current concentrates in portions where the reaction layer is thin, the reaction phase easily disappears by electromigration. After the reaction phase disappears, Cu electrodes and solder directly contact each other, and diffusion of Cu from the Cu electrodes into solder is accelerated, causing open circuits to occur in short period of time.

The addition of Co can also refine β-Sn crystal grains in the vicinity of the reaction phase to 30 μm or smaller, so the working life until fracture occurs due to electromigration can be extended.

A small amount of Fe may be added to a Sn—Ag—Bi—In alloy according to the present invention. When Fe is added, its content is preferably 0.01-0.1%.

Sn: Remainder

Sn constitutes substantially the remainder of the solder alloy. There is no particular upper limit on the Sn content but generally it is 94 mass %.

A solder alloy used in a solder joint according to the present invention can be manufactured by usual methods for manufacturing a solder alloy, and the solder alloy at the time of manufacture can be formed into a shape suitable for the soldering method used to form a solder joint. For example, a solder alloy according to the present invention may be used in the form of ingots, bars, rods, solder balls, solder powder, or solder wire. In addition, it may be used after being formed into various types of preforms such as pellets or disks.

When the solder alloy is used as a solder paste, a solder alloy powder is mixed with a suitable flux in a conventional manner.

EXAMPLES

In order to investigate the effects of a solder joint according to the present invention, solder joint according to the present invention and conventional solder joint were prepared by soldering a Cu component to lands by the reflow soldering method using solder paste, and the properties of the resulting solder joints were measured. Solder powders having the solder alloy compositions shown in Table 1 were admixed with flux to prepare solder pastes.

Figure 3:
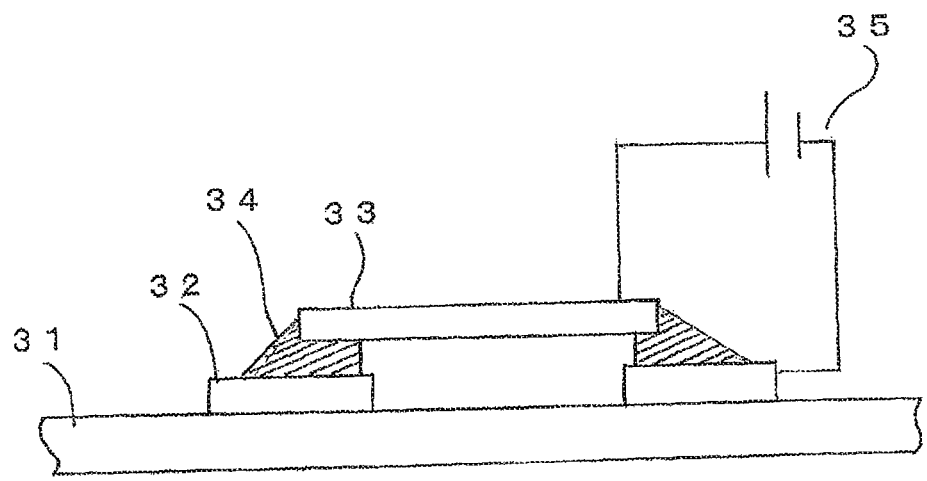
FIG. 3 is an explanatory view showing the state of solder connection in an example of the present invention.

As shown in FIG. 3, a solder paste was printed on copper electrodes of a printed circuit board 31 using a stencil, for example, and then a rectangular Cu plate 33 was placed atop the paste. The printed circuit board 31 and the copper plate 33 were heated in a reflow furnace to melt the solder paste, and then the resulting assembly was cooled to obtain solder joints 34 connecting the Cu plate 33 to lands 32 of the printed circuit board 31. FIG. 3 schematically shows the state of the printed circuit board 31 at this time.

A heat cycle test was carried out in the following manner.

A six-layer FR4 printed circuit board with a thickness of 1.6 mm was used. A solder paste to be tested was printed in a soldering pattern (1.6×1.2 mm) to a thickness of 150 μm with the same opening size as the electrodes of the printed circuit board. Ceramic chip resistors measuring 3.2×1.6×0.6 mm were mounted on the solder paste using a Model SMT-2000V automatic part mounter manufactured by Suzuki Co., Ltd., and then soldering was carried out using a Model SNR-825 reflow oven manufactured by Senju Metal Industry Co., Ltd. with a peak temperature of 240° C. and an oxygen concentration of at most 500 ppm.

To test for thermal fatigue, a Model TSA-101 thermal shock tester of the air circulation type manufactured by Espec Corporation was used. The above soldered assembly was held for thirty minutes at each of −55° C. and +125° C., and exposure to room temperature was zero minutes. Every 500 cycles, the shear strength of 10-15 joints of each chip part was measured using a Model STR-1000 shear tester manufactured by Rheska Corporation. The size of the shear tool was 3 mm wide×2 mm thick and the speed was 5 mm per minute.

In order to ascertain the life span of solder joints, the minimum bonding strength of a 3216-size part was made 15N. The cumulative number of solder joints having a strength of 15N or less was calculated every 500 cycles. Failure was made the point at which the cumulative number exceeded 10%, and the previous 500 cycles was made the life span of the solder joints. The results are shown in Table 1.

An electromigration test was carried out in the following manner.

When determining resistance to electromigration, a copper plate 33 and a land 32 of a printed circuit board 31 were connected to a suitable power supply 35 as shown in FIG. 3, and a current was passed between the Cu plate 33 and the land 32 of the printed circuit board 31. This current was supplied until the electrical resistance increased by 5% or 10% while maintaining the printed circuit board 31 at 125° C. in air. After conduction was completed, the cross section of the solder joint 34 near the bottom of fillets of the solder joint 34 was observed with an electron microscope. The reason why the fillet region was observed is because this is the location where the current density is thought to be highest.

In this example, solder alloys having the compositions shown in Table 1 were used. The results are also shown in Table 1.

Finally, the solder fillets of a printed circuit board 1 after soldering in a reflow furnace set to a peak reflow temperature of 240° C. were checked with an X-ray transmission apparatus to investigate voids in the solder joints. Compositions for which voids constituted at least 20% of the surface area of the cross section of the joints were evaluated as × (poor), those for which voids constituted 10-20% of the surface area were evaluated as Δ (fair), and those for which voids constituted less than 10% of the surface area were evaluated as ○ (good). The results are shown in Table 1.

TABLE 1

| | | Alloy composition (mass %) | | | | | | Temp. cycle test (cycles) | Life of joint (h) 10% increase | Life of joint (h) 5% increase | % Defects* after 500 h N = 15 | Voids |
|---|---|---|---|---|---|---|---|---|---|---|---|---|
| | | Sn | Ag | Bi | In | Ni | Co | Fe | | | | |
| EXAMPLE | 1 | rem | 2 | 2 | 2 | | | | 2000 | 400 | — | 13 | — |
| | 2 | rem | 2 | 3 | 4 | | | | 2000 | 400 | — | 7 | — |
| | 3 | rem | 2.5 | 3 | 4 | | | | 2500 | 400 | — | 0 | — |
| | 4 | rem | 3 | 3 | 4 | | | | 3500 | 400 | 200 | 0 | — |
| | 5 | rem | 3.2 | 3 | 4 | | | | 3500 | 400 | — | 0 | — |
| | 6 | rem | 4 | 3 | 4 | | | | 3000 | 400 | — | 0 | — |
| | 7 | rem | 3 | 2 | 4 | | | | 3000 | 400 | — | 7 | — |
| | 8 | rem | 3 | 2.5 | 4 | | | | 3500 | 400 | — | 7 | — |
| | 9 | rem | 3 | 3 | 4 | | | | 4000 | 400 | — | 0 | — |
| | 10 | rem | 3 | 3.5 | 4 | | | | 4000 | 400 | — | 0 | — |
| | 11 | rem | 3 | 4 | 4 | | | | 3500 | 400 | — | 0 | — |
| | 12 | rem | 3 | 4 | 5 | | | | 3000 | 400 | — | 13 | — |
| | 13 | rem | 3 | 3 | 2 | | | | 2500 | 400 | — | 7 | — |
| | 14 | rem | 3 | 3 | 3 | | | | 3500 | 400 | — | 0 | — |
| | 15 | rem | 3 | 3 | 3.5 | | | | 4000 | 400 | — | 0 | — |
| | 16 | rem | 3 | 3 | 4.5 | | | | 3500 | 400 | — | 0 | — |
| | 17 | rem | 3 | 3 | 5 | | | | 2500 | 400 | — | 7 | — |
| | 18 | rem | 3 | 3 | 4 | 0.02 | | | 3500 | 400 | 200 | — | o |
| | 19 | rem | 3 | 3 | 4 | 0.05 | | | 3500 | 450 | 250 | — | o |
| | 20 | rem | 3 | 3 | 4 | 0.1 | | | 3500 | ≥500 | 300 | — | o |
| | 21 | rem | 3 | 3 | 4 | 0.15 | | | 3500 | ≥500 | 350 | — | o |
| | 22 | rem | 3 | 3 | 4 | 0.2 | | | 3500 | ≥500 | 350 | — | Δ |
| | 23 | rem | 3 | 3 | 4 | 0.3 | | | 3500 | ≥500 | 350 | — | x |
| | 24 | rem | 3 | 3 | 4 | | 0.02 | | 3500 | 400 | 200 | — | o |
| | 25 | rem | 3 | 3 | 4 | | 0.05 | | 3500 | 450 | 250 | — | o |
| | 26 | rem | 3 | 3 | 4 | | 0.1 | | 3500 | ≥500 | 300 | — | o |
| | 27 | rem | 3 | 3 | 4 | | 0.15 | | 3500 | ≥500 | 350 | — | o |
| | 28 | rem | 3 | 3 | 4 | | 0.2 | | 3500 | ≥500 | 350 | — | Δ |
| | 29 | rem | 3 | 3 | 4 | | 0.3 | | 3500 | ≥500 | 350 | — | x |
| | 30 | rem | 3 | 3 | 4 | | | 0.02 | 3500 | ≥500 | 200 | — | o |
| | 31 | rem | 3 | 3 | 4 | | | 0.1 | 3500 | ≥500 | 400 | — | Δ |
| | 32 | rem | 3 | 3 | 4 | 0.05 | 0.05 | | 3500 | ≥500 | 400 | — | o |
| | 33 | rem | 3 | 3 | 4 | 0.1 | 0.1 | | 3500 | ≥500 | ≥500 | — | o |
| | 34 | rem | 3 | 3 | 4 | | 0.1 | 0.05 | 3500 | ≥500 | ≥500 | — | o |
| | 35 | rem | 3 | 3 | 4 | 0.1 | | 0.05 | 3500 | ≥500 | ≥500 | — | o |
| | 36 | rem | 3 | 4 | 3 | | | | 4000 | 400 | — | 0 | — |
| | 37 | rem | 3 | 4 | 2 | | | | 2500 | 400 | — | 7 | — |
| | 38 | rem | 3 | 2.5 | 2.5 | | | | 2000 | 400 | — | 7 | — |
| | 39 | rem | 3 | 2 | 3 | | | | 2000 | 400 | — | 7 | — |
| | 40 | rem | 3 | 2.5 | 4.5 | | | | 2500 | 400 | — | 7 | — |
| | 41 | rem | 3 | 2 | 5 | | | | 2500 | 400 | — | 13 | — |
| COMPAR | 1 | rem | 1.5 | 3 | 4 | | | | 1500 | 400 | — | 7 | — |
| | 2 | rem | 3 | 1.5 | 1.5 | | | | 1000 | 200 | — | 33 | — |
| | 3 | rem | 3 | 1.5 | 4 | | | | 1500 | 300 | — | 20 | — |
| | 4 | rem | 3 | 7 | 4 | | | | 1500 | 100 | — | 27 | — |
| | 5 | rem | 3 | 7 | 7 | | | | 500 | 100 | — | 33 | — |
| | 6 | rem | 3 | 3 | 1.5 | | | | 2000 | 300 | — | 20 | — |
| | 7 | rem | 3 | 3 | 7 | | | | 500 | 100 | — | 20 | — |
| | 8 | rem | 3 | 5 | 4 | | | | 3000 | 400 | — | 20 | — |
| | 9 | rem | 4 | 4 | 6 | | | | 500 | 300 | — | 20 | — |
| | 10 | rem | 3 | 4 | 1.5 | | | | 2000 | 300 | — | 20 | — |

*Defects = 20% increase in resistance

Figure 4:
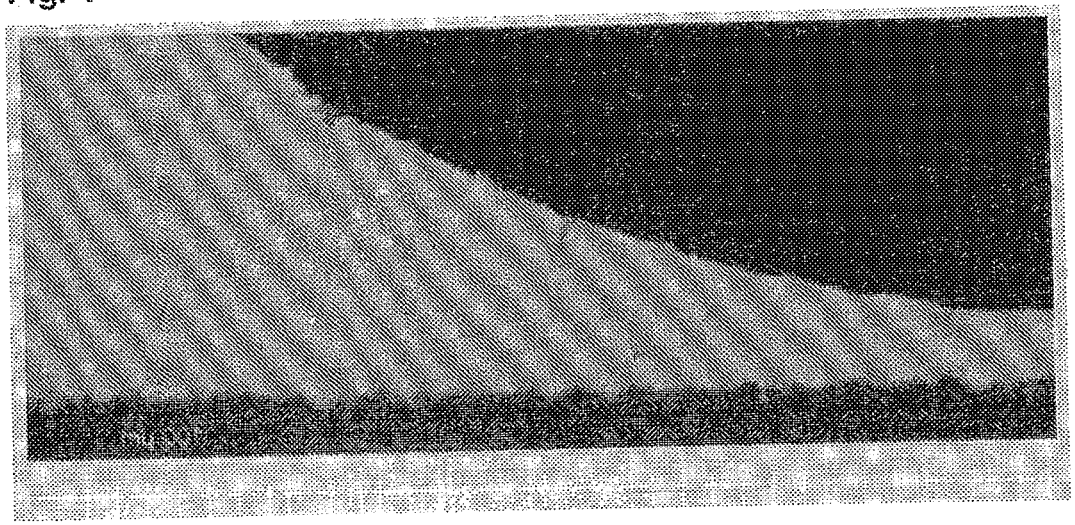
FIG. 4 is an electron photomicrograph showing the state of a copper land before conducting current in an example of the present invention.

FIG. 4 is an electron photomicrograph showing the state of a copper land before passage of current in an example of the present invention.

Figure 5:
FIG. 5 is an electron photomicrograph showing the state of a copper land which had an increase in resistance of 5% after conducting 20 amperes at 125° C. in an example of the present invention.

FIG. 5 is an electron photomicrograph showing the state of a copper land when the resistance increased by 5% after carrying a current of 20 amperes at 125° C. in an example of the present invention.

Figure 6:
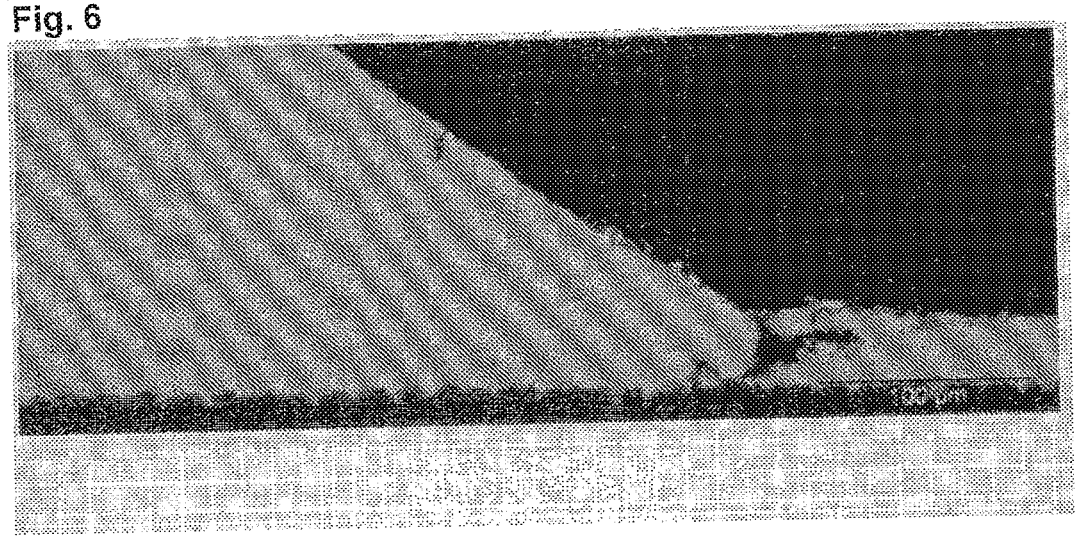
FIG. 6 is an electron photomicrograph showing the state of a copper land which had an increase in resistance of 10% after conducting 20 amperes at 125° C. in an example of the present invention.

FIG. 6 is an electron photomicrograph showing the state of a copper land when the resistance increased by 10% after carrying a current of 20 amperes at 125° C. in an example of the present invention.

Comparing FIG. 5 and FIG. 6 with FIG. 4 before the conduction test, the Cu lands of the printed circuit board became significantly thinner due to electromigration. From FIG. 5 and FIG. 6, it can be seen that fracture occurred in the portion of a solder joint shown as a black region. In this region, the solder joint and the Cu land of the printed circuit board were no longer connected with each other.

It was confirmed that a Sn—Ag—Bi—In alloy used in a solder joint according to the present invention had far superior fatigue resistance compared to either a Sn—Ag—Cu alloy or a Sn—Cu alloy.

From the above-described test results, it can be seen that there is substantially no occurrence of electromigration even if a solder joint according to the present invention is used for long periods at a current density in the range of 5-100 kA/cm$^2$. At the same time, the solder joint has excellent heat cycle resistance and fatigue resistance. Accordingly, a solder joint according to the present invention is particularly suitable for electronic equipment operating with a high current producing a high current density such as power transistors and other electrical equipment.

The invention claimed is:

1. A process for preventing electromigration in a solder joint in which a current with a current density of 5-100 kA/cm² flows through at least a portion thereof, comprising:
   providing a solder joint between an electronic part and a Cu land or Ni land of a printed circuit board; and
   applying the current having the current density of 5-100 kA/cm² through at least the portion of the solder joint,
   wherein the solder joint is formed of a solder alloy consisting of 2-4 mass % of Ag, 2-4 mass % of Bi, 2-5 mass % of In, optionally at least one element selected from 0.05-0.3 mass % of Ni and 0.01-0.32 mass % of Co, and a remainder of Sn, and
   wherein a reaction layer comprised of an intermetallic compound of $(CuNi)_6(SnIn)_5$ or $(CuCo)_6(SnIn)_5$ is formed between the solder alloy and the land, so that electromigration is prevented under a current density of 5-100 kA/cm².

2. The process for preventing electromigration in a solder joint according to claim 1, wherein a content of Ag in the solder alloy is 2.5-4 mass %.

3. The process for preventing electromigration in a solder joint according to claim 1, wherein a content of Bi in the solder alloy is 2-3 mass %.

4. The process for preventing electromigration in a solder joint according to claim 1, wherein a content of In in the solder alloy is 3-4 mass %.

5. The process for preventing electromigration in a solder joint according to claim 1, wherein the solder alloy consists of 2-4 mass % of Ag, 2-4 mass % of Bi, 2-5 mass % of In, 0.05-0.3 mass % of Ni, 0.05-0.32 mass % of Co, and a remainder of Sn.

6. The process for preventing electromigration in a solder joint according to claim 5, wherein the solder alloy consists of 2-4 mass % of Ag, 2-4 mass % of Bi, 2-5 mass % of In, 0.1-0.3 mass % of Ni, 0.05-0.32 mass % of Co, and a remainder of Sn.

7. The process for preventing electromigration in a solder joint according to claim 1, wherein the reaction layer is comprised of intermetallic compounds of $(CuNi)_6(SnIn)_5$ and $(CuCo)_6(SnIn)_5$.

8. The process for preventing electromigration in a solder joint according to claim 1, wherein a crystal grain size of the solder joint is at most 50 microns.

9. The process for preventing electromigration in a solder joint according to claim 1, wherein the solder joint is made from a solder paste with reflow soldering.

10. The process for preventing electromigration in a solder joint according to claim 1, wherein during application of the current through the solder joint, transformation of β-Sn into γ-Sn and β-Sn is suppressed for preventing the electromigration.

11. A process for preventing electromigration in a solder joint in which a current with a current density of 5-100 KA/cm² flows through at least a portion of the solder joint, comprising:
   providing the solder joint between an electronic part and a Cu land or Ni land of a printed circuit board; and
   applying the current having the current density of 5-100 kA/cm² through at least the portion of the solder joint,
   wherein the solder joint is made of a solder alloy consisting of 2-4 mass % of Ag, 2-4 mass % of Bi, 2-5 mass % of In, optionally containing at least one element selected from 0.01-0.3 mass % Ni, 0.01-0.32 mass % of Co, and 0.01-0.1 mass % of Fe, and a remainder of Sn.

12. The process for preventing electromigration according to claim 11, wherein during application of the current through the solder joint, transformation of β-Sn into γ-Sn and β-Sn is suppressed for preventing the electromigration.

* * * * *